Figure 1:
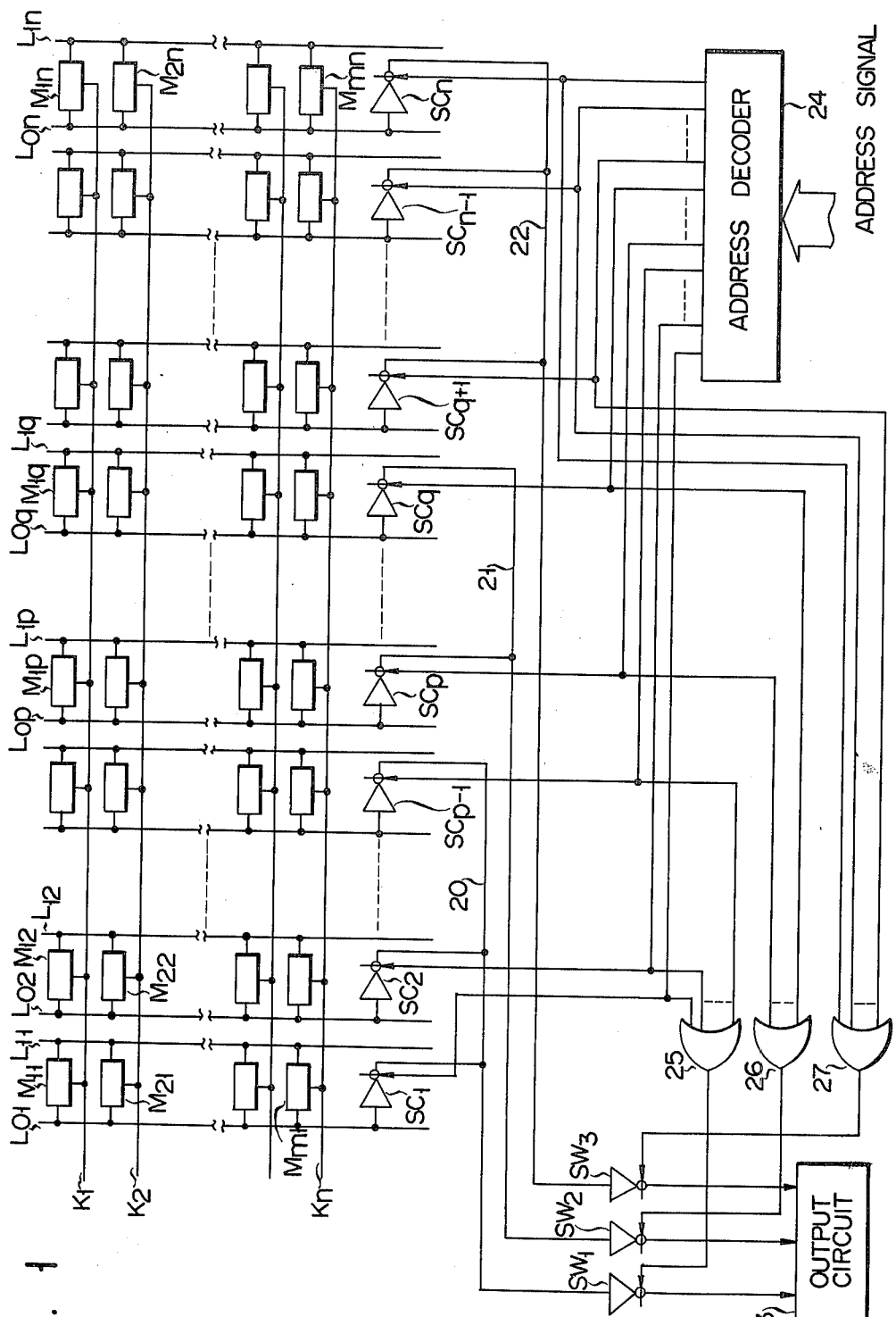

United States Patent [19]

Suzuki et al.

[11] 4,114,192

[45] Sep. 12, 1978

[54] SEMICONDUCTOR MEMORY DEVICE TO REDUCE PARASITIC OUTPUT CAPACITANCE

[75] Inventors: Yasoji Suzuki, Ayase; Kiyofumi Ochii, Kawasaki, both of Japan

[73] Assignee: Tokyo Shibaura Electric Co., Ltd., Tokyo, Japan

[21] Appl. No.: 777,663

[22] Filed: Mar. 15, 1977

[30] Foreign Application Priority Data

Mar. 16, 1976 [JP] Japan .................................. 51-28521

[51] Int. Cl.$^2$ ............................................ G11C 7/06
[52] U.S. Cl. .................................... 365/189; 365/190
[58] Field of Search .................... 340/173 R; 307/205; 365/189, 190

[56] References Cited

U.S. PATENT DOCUMENTS

| | | | |
|---|---|---|---|
| 3,665,426 | 5/1972 | Gross et al. | 340/173 R |
| 3,969,706 | 7/1976 | Proebsting et al. | 340/173 R |
| 4,040,015 | 6/1976 | Fukuda | 307/205 |

OTHER PUBLICATIONS

Curtis, Complementary Metal-Oxide Semiconductor Logic Testability, IBM Technical Disclosure Bulletin, vol. 16, No. 2, 7/73, pp. 404–405.

Scarpero, Field-Effect Transistor Bidirectional Driver Control Circuit, IBM Technical Disclosure Bulletin, vol. 16, No. 8, 1/74, pp. 2442–2443.

Primary Examiner—Stuart N. Hecker
Attorney, Agent, or Firm—Finnegan, Henderson, Farabow & Garrett

[57] ABSTRACT

A semiconductor memory device includes a memory circuit formed of a plurality of matrix-arranged memory cells, a plurality of output data lines, each of which is connected to memory cells arranged in the same column of the matrix memory circuit, and a plurality of data-sensing circuits for delivering output data from the matrix memory circuit to an output device. The data-sensing circuits are divided into a plurality of groups, and the semiconductor memory device further comprises clocked inverters whose input terminals are connected to the output terminals of the respective groups of sensing circuits and whose output terminals are connected to the output device, and a control circuit which, when one of the data-sensing circuits issues an output, supplies an energizing signal to that of the clocked inverters which is connected to said one data-sensing circuit.

4 Claims, 7 Drawing Figures

SEMICONDUCTOR MEMORY DEVICE TO REDUCE PARASITIC OUTPUT CAPACITANCE

This invention relates to a semiconductor memory device acquiring a short access time.

The known semiconductor memory device is a static type which comprises a plurality of matrix-arranged memory cells, row and column selection lines connected to the memory cells to select a specified one therefrom and data-sensing circuits respectively connected to the column selection lines. Particularly with the above-mentioned type of semiconductor memory device, it has been demanded to shorten access time. However, the prior art semiconductor memory devices are so designed that the output terminals of all data-sensing circuits are jointly connected to a common data-sensing line, and output data is read out through this common data-sensing line. Consequently, a parasitic capacitor arises on the output sides of the respective data-sensing circuits. Occurrence of such parasitic capacitor makes it difficult to shorten the access time of the conventional semiconductor memory device. In recent years, a large capacity memory device has been widely accepted to handle a large amount of information. Such memory device generally comprises scores of or a larger number of data-sensing circuits.

When the output terminals of such numerous data-sensing circuits are jointly connected to a common data-sensing line, a parasitic capacitor almost always arises between the common data-sensing line and a respective voltage point with a magnitude substantially proportional to a number of data-sensing circuits used, resulting in a prominent extension of the accesss time of the memory device.

It is accordingly the object of this invention to provide a semiconductor memory device having a short data access time.

According to an aspect of the invention, there is provided a semiconductor memory device which comprises storing means including a plurality of matrix-arranged memory cells and output data lines connected to said plurality of memory cells; and data-sensing circuits respectively connected to the output data lines of said storing means to detect output data from the memory cells, and wherein the data-sensing circuits are divided into a plurality of groups and two output terminals of the respective groups of data-sensing circuits are connected together.

Figure 2:
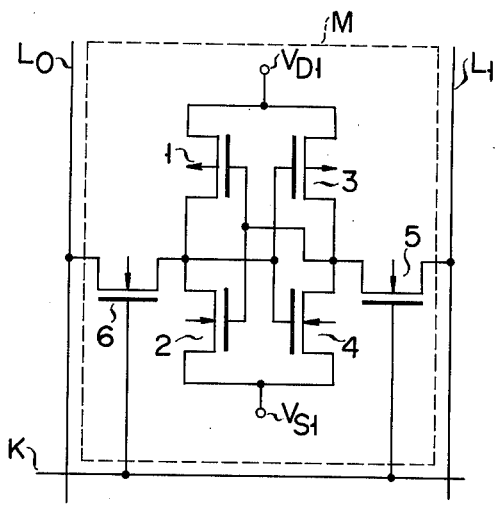
Figure 3:
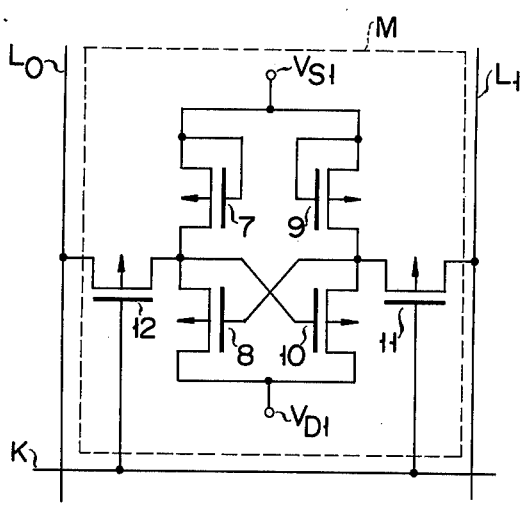
Figure 5:
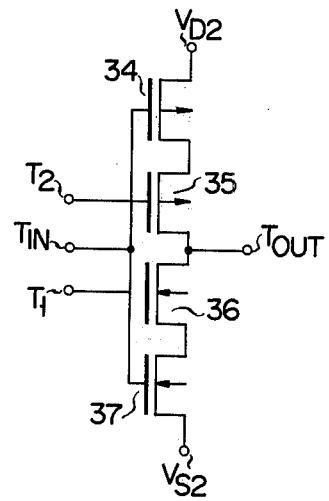
Figure 6:
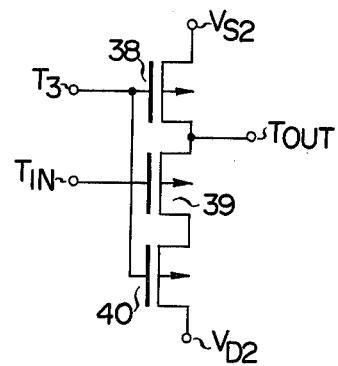
Figure 7:
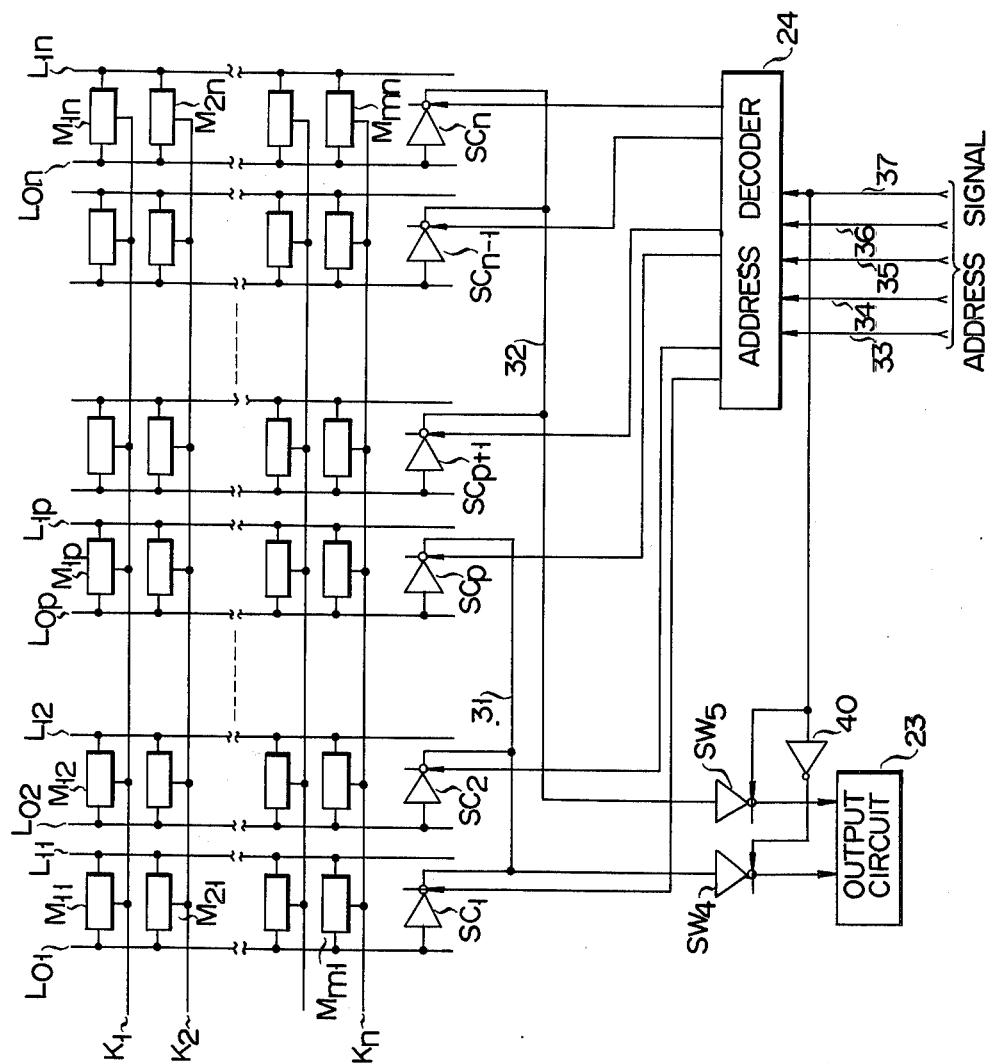

This invention can be more fully understood from the following detailed description when taken in conjunction with the accompanying drawings, in which:

FIG. 1 is a circuit diagram of a semiconductor memory device according to an embodiment of this invention, FIGS. 2 and 3 are circuit diagrams of memory cells applicable to the semiconductor memory device of FIG. 1, FIGS. 4 to 6 are circuit diagrams of clocked inverters applicable to the semiconductor memory device of FIG. 1, and FIG. 7 is a circuit diagram of a semiconductor memory device according to another embodiment of this invention.

Referring to FIG. 1 showing the circuit arrangement of a semiconductor memory device according to an embodiment of this invention, a plurality of memory cells M are arranged in the matrix form comprising rows $m$ and columns $n$. The memory cell M is formed of, for example, $p$ and $n$ channel type insulated gate field effect transistors (hereinafter abbreviated as "IGFET'S") as shown in FIG. 2 or $p$ channel type IGFET'S as shown in FIG. 3.

Referring to FIG. 2, the memory cell M comprises a P channel type IGFET 1 and $n$ channel type IGFET 2 connected in series between power sources $V_{D1}$, and $V_{S1}$; a $p$ channel type IGFET 3 and $n$ channel type IGFET 4 connected in series between the power sources $V_{D1}$ and $V_{S1}$; an $n$ channel type IGFET 5, one end of which is connected to the gates of the FET's 1, 2 and also to a junction of the IGFET's 3, 4; and an $n$ channel type IGFET 6, one end of which is connected to the gates of the IGFET's 3, 4 and also to a junction of the IGFET's 1, 2. With the memory cell M, the FET's 5, 6 are rendered conductive when a row selection line K is energized, thereby enabling data to be written in or read out of the memory cell M through input-output data lines $L_0$ and $L_1$ connected to the other side ends of the FET's 5, 6. The input-output data lines $L_0$, $L_1$ are supplied with data signals in inverted relationship to each other.

The memory cell M of FIG. 3 comprises $p$ channel type IGFET's 7, 8 connected in series between the power sources $V_{D1}$ and $V_{S1}$, $p$ channel type IGFET's 9, 10 connected in series similarly between the power sources $V_{D1}$ and $V_{S1}$; a $p$ channel type IGFET 11, one end of which is connected to the gate of the IGFET 8 and also to a junction of the IGFET's 9, 10; and a $p$ channel type IGFET 12, one end of which is connected to the gate of the IGFET 10 and also to a junction of the IGFET's 7, 8. The gates of the IGFET's 7, 9 are connected to the power source $V_{S1}$. Data are written in or read out of the memory cell M of FIG. 3 through the row selection line K and input-output data lines $L_0$, $L_1$ as in the memory cell of FIG. 2.

The input-output lines $L_{01}$ to $L_{0n}$, $L_{11}$ to $L_{1n}$ and the row selection lines $K_1$ to $K_m$ all shown in FIG. 1 correspond to the input-output lines $L_0$, $L_1$ and row selection line K shown in FIGS. 2 and 3. The input-output lines $L_{01}$ to $L_{0n}$ are connected to data-sensing circuits $SC_1$ to $SC_n$ formed of the later-described clocked inverters. With the above-mentioned embodiment of this invention, the output terminals of the data-sensing circuits $SC_1$ to $SC_n$ are divided into three groups. The output terminals of data-sensing circuits $SC_1$ to $SC_{p-1}$ constituting a first group are connected to a first common data-sensing line 20. The output terminals of data-sensing circuits $SC_p$ to $SC_q$ constituting a second group are connected to a second common data-sensing line 21. The output terminals of data-sensing circuits $SC_{q+1}$ to $SC_n$ constituting a third group are connected to a third common data-sensing line 22. The first, second and third common data-sensing lines 20, 21, and 22 are connected to inversion type switching circuits $SW_1$ to $SW_3$ which are connected to an output circuit 23 and formed of the later discribed clocked inverters.

The clock terminals of the data-sensing circuits $SC_1$ to $SC_n$ are connected to the output terminal of an address decoder 24 for decoding address signals supplied from a data-processing unit (not shown). The output terminals of the address decoder 24 connected to the first to the third groups of data-sensing circuits $SC_1$ to $SC_{p-1}$, $SC_p$ to $SC_q$, $SC_{q-1}$ to $SC_n$ are connected to the clock terminals of switching circuits $SW_1$ to $SW_3$ through OR gates 25 to 27.

Figure 4:
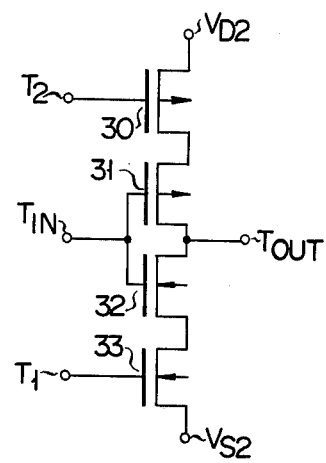

Clocked inverters constituting data-sensing circuits $SC_1$ to $SC_n$ and switching circuits $SW_1$ to $SW_3$ are each formed of a plurality of IGFET's as shown in FIGS. 4 to 6. Referring to FIG. 4, p channel type IGFET's 30, 31 and n channel type IGFET's 32, 33 are all connected in series between the power sources $V_{D2}$ and $V_{S2}$. The gate terminals $T_1$, $T_2$ of the IGFET's 33, 30 are supplied with signals inverted from each other. When an address signal and its inversion signal are delivered to the gate terminals $T_1$, $T_2$, then the IGFET's 33, 30 are jointly rendered conductive. When, therefore, an input terminal $T_{IN}$ of the clocked inverter is supplied with a high level signal, then the IGFET 32 is rendered conductive, so that an output terminal $T_{OUT}$ is coupled to the power source $V_{S2}$ and a low level signal is issued from the output terminal $T_{OUT}$ of said inverter. Conversely when the input terminal $T_{IN}$ receives a low level signal, then the IGFET 31 becomes conductive and a high level signal is sent forth from the output terminal $T_{OUT}$. The gate terminals $T_1$ and $T_2$ are used as the clock terminal of the clocked inverter constituting the data-sensing circuit or switching circuit.

Referring to FIG. 5, p channel type IGFET's 34, 35 and n channel type IGFET's 36, 37 are connected in series between the power sources $V_{D2}$ and $V_{S2}$. An input terminal $T_{IN}$ is connected to the gates of the IGFET's 34, 37. Gate terminals $T_1$, $T_2$ are connected to the gates of the IGFET's 36, 35, respectively. An output terminal $T_{OUT}$ is connected to a junction of the IGFET's 35, 36. The clocked inverter of FIG. 5 is operated in the same manner as that of FIG. 4.

Referring to FIG. 6, three p channel type IGFET's 38 to 40 are connected in series between the power sources $V_{D2}$ and $V_{S2}$. A gate terminal $T_3$ is connected to the gates of the IGFET's 38, 40. The input terminal $T_{IN}$ is connected to the gate of the IGFET 39. The output terminal $T_{OUT}$ is connected to a junction of the IGFET's 38, 39. When the gate terminal $T_3$ is supplied with an address signal or clock signal, then the IGFET's 38, 40 are jointly rendered conductive. When a high level signal is delivered to the input terminal $T_{IN}$, then the IGFET 39 does not become conductive. Therefore, the output terminal $T_{OUT}$ is coupled to the power source $V_{S2}$, causing a low level signal to be sent forth. When a low level signal is supplied to the input terminal $T_{IN}$, then the IGFET 39 is operated, and the output terminal $T_{OUT}$ is connected to the power source $V_{D2}$, with the resultant issue of a high level signal.

With the embodiment of FIG. 1, the data-sensing circuits $SC_1$ to $SC_n$ are divided into three substantially equal groups and common lines 20, 21, and 22 are provided for the respective groups. Therefore, parasitic capacitances arising in the respective output lines have the magnitude reduced to one-third of that which occurs in the case where the data-sensing circuits are all connected to a single common data-sensing line, as in the prior art semiconductor memory device. A parasitic capacitor occurring on the output side of the clocked inverters $SW_1$ to $SW_3$ used to connect the output circuit 23 to the three common data-sensing lines 20, 21, and 22 provided for the above-mentioned three groups of data-sensing circuits can be made fully smaller than the capacitor occurring on the output terminal of the data-sensing circuits, thereby little affecting the access time of a memory circuit included in the semiconductor memory device of this invention.

This invention has been described by reference to the foregoing embodiment representing a static type semiconductor memory device. However, the invention is not limited thereto, but may be applicable to a dynamic type semiconductor memory device. With the above-mentioned embodiment, data-sensing circuits were provided at the lower end portion of the input-output lines, but may be disposed in the intermediate portion of the input-output lines. Further the sensing circuits were divided in three groups, but instead may be divided into two groups or more than three groups.

Referring to FIG. 7 showing a semiconductor memory device according to another embodiment of this invention, data-sensing circuits $SC_1$ to $SC_n$ are provided in a number of $2^N$. The data-sensing circuits $SC_1$ to $SC_n$ are divided into two groups of sensing circuits $SC_1$ to $SC_p$ and $SC_{p+1}$ to $SC_n$. Each group includes the same number or $2^{N-1}$ number of sensing circuits. The output terminals of the data-sensing circuits $SC_1$ to $SC_p$ constituting a first group are jointly connected to a first common data-sensing line 31. The output terminals of the data-sensing circuits $SC_{p+1}$ to $SC_n$ constituting a second group are jointly connected to a second common data-sensing line 32. The first and second common data-sensing lines 31, 32 are connected to the output circuit 23 through inverters $SW_4$, $SW_5$ acting as switching elements. The control terminals of the data-sensing circuits $SC_1$ to $SC_n$ are connected to the output terminals of the address decoder 24 as in FIG. 1. The address decoder 24 receives address signal from a data-processing unit (not shown) through address signal lines 33 to 37. The address signal line 37 is connected to the clock terminal of the clocked inverter $SW_4$ through an inverter 40, and also directly to the clock terminal of the clocked inverter $SW_5$.

There will now be described with reference to Table 1 below the operation of a semiconductor memory device according to the second embodiment of FIG. 7. As is understood from the Table 1, $2^5 = 32$ sensing circuits $SC_1$ to $SC_n$ are used and the sensing circuits are divided into two groups which are each formed of 16 sensing circuits.

TABLE 1

| Address | | 1 | 2 | 15 | 16 | 17 | 18 | 31 | 32 |
|---|---|---|---|---|---|---|---|---|---|
| State of lines | 33 | 0 | 1 | 0 | 1 | 0 | 1 | 0 | 1 |
| | 34 | 0 | 0 | 1 | 1 | 0 | 0 | 1 | 1 |
| | 35 | 0 | 0 | 1 | 1 | 0 | 0 | 1 | 1 |
| | 36 | 0 | 0 | 1 | 1 | 0 | 0 | 1 | 1 |
| | 37 | 0 | 0 | 0 | 0 | 1 | 1 | 1 | 1 |

When energized, the address signal lines 33 to 37 indicate address values of $2^0$, $2^1$, $2^2$, $2^3$, $2^4$ respectively. These address signal lines 33 to 37 are selectively energized to show a particular one of the 32 addresses shown in Table 1. As apparent from Table 1 above, when the address decoder 24 shows any of the first to the sixteenth addresses, namely, when a clock signal is supplied to any of the data-sensing circuits $SC_1$ to $SC_p$ of the first group, then the address signal line 37 has a level of "0". Since, at this time, the clocked inverter $SW_4$ is supplied with a clock signal through the inverter 40 upon receiving an output of "0" level from the address signal line 37, a data signal read out of any of the data-sensing circuits $SC_1$ to $SC_p$ is sent forth to the output circuit 23 through the clocked inverter $SW_4$. When the address decoder 24 designates any of the 17th to the 32nd addresses, namely, when a clock pulse is supplied to any of the data-sensing circuits $SC_{p+1}$ to $SC_n$ of the second group, then the address signal line 37 has a level of "1". Since, at this time, the clocked inverter $SW_5$ is supplied with a clock signal upon receipt of an output of "1" level from the address signal line 37, a data signal read out of any of the data-sensing circuits $SC_{p+1}$ to $SC_n$ of the second group is conducted to the output circuit 23 through the clocked inverter $SW_5$.

The second embodiment of FIG. 7 comprises five address signal lines 33 to 37 for selective energization of 32 data-sensing circuits $SC_1$ to $SC_n$. However, it is possible to provide a different number of address signal lines for selective energization of any of the data-sensing circuits of the corresponding number. In FIG. 7, the data-sensing circuits are divided into two equal groups, but may be divided into groups having a number of $2^Q$ (Q is an integer falling within the range of $2 \leq Q < N$). In this case, it is necessary to provide clocked inverters acting as switching elements SW in a number corresponding to that of groups into which data-sensing circuits are devided. The switching elements are controlled according to the condition of a plurality of address signal lines.

What we claim is:

1. In a semiconductor memory device for reading data from and writing data into memory cells comprising storing means formed of a plurality of substantially identical memory cells arranged in a single matrix array with output data lines connected to the plurality of memory cells, sensing means including a plurality of first data-sensing circuits each connected to an output data line of the storing means to detect output data from the memory cells, and a master output line coupled to the output terminals of said first data-sensing circuits, the improvement comprising means for reducing parasitic capacitance affecting said master output line including the first data-sensing circuits being divided into a plurality of groups and the outputs of the first data-sensing circuits of the respective groups being connected together to permit the data detected by said first data-sensing circuits to be transferred to said master output line at a higher speed, said sensing means further including a plurality of second data-sensing circuits respectively connected between said master output line and the groups of outputs of said first data-sensing circuits, and control circuit means for selectively supplying an energizing signal to each said first data-sensing circuit one at a time and for selectively sending forth a control signal to the one second data-sensing circuit connected to that group of first data-sensing circuits to which the then selectively energized first data-sensing circuit belongs.

2. The semiconductor memory device according to claim 1, wherein the first and second data-sensing circuits each comprises a clocked inverter formed of first, second and third insulated gate field effect transistors connected in series between first and second power sources, said inverter being the type in which the gates of the first and third insulated gate field effect transistors are supplied with an energizing signal, and upon receipt of an input signal at the gate of the second insulated gate field effect transistor, an output signal is sent forth from a junction of the first and second insulated gate field effect transistors.

3. The semiconductor device according to claim 1, wherein the first data-sensing circuits are divided into equal groups in a number of $2^Q$ where Q is a positive integer; the control circuit means is formed of address signal lines having a larger number than that represented by the index Q and an address decoder for decoding address signals received through the address signal lines for selective energization of the first data-sensing circuits; and said second data-sensing circuits are connected to those of the address signal lines which are provided in the index number Q and controlled by a combination of output signals from the address signal lines of said index number Q.

4. The semiconductor memory device according to claim 3, wherein the first data-sensing circuits are divided into two equal groups; two second data-sensing circuits are connected to the respective groups of first data-sensing circuits; one of the address signal lines is directly connected to the control terminal of one of the second data-sensing circuits and also to the control terminal of the other second data-sensing circuit through an inverter; when one of the first data-sensing circuits belonging to one of the two groups is selectively energized by the address decoder, then said one of the second data-sensing circuits is energized by an output from said one of the address signal lines, and when one of the first data-sensing circuits belonging to the other group is energized, then the other second data-sensing circuit is energized by an output signal from said one of the address signal lines.

* * * * *